US010438908B2

(12) United States Patent
Roiz et al.

(10) Patent No.: US 10,438,908 B2
(45) Date of Patent: Oct. 8, 2019

(54) INTEGRALLY FORMED BIAS AND SIGNAL LEAD FOR A PACKAGED TRANSISTOR DEVICE

(71) Applicant: NXP USA, Inc., Austin, TX (US)

(72) Inventors: Arturo Roiz, Tempe, AZ (US); Justin Nelson Annes, Chandler, AZ (US); Terry L. Thomas, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 30 days.

(21) Appl. No.: 15/787,903

(22) Filed: Oct. 19, 2017

(65) Prior Publication Data
US 2019/0123002 A1 Apr. 25, 2019

(51) Int. Cl.
| H01L 23/66 | (2006.01) |
| H01L 23/047 | (2006.01) |
| H01L 23/22 | (2006.01) |
| H01L 23/00 | (2006.01) |

(52) U.S. Cl.
CPC ............ H01L 23/66 (2013.01); H01L 23/047 (2013.01); H01L 24/48 (2013.01); H01L 24/49 (2013.01); *H01L 2223/665* (2013.01); *H01L 2224/48091* (2013.01); *H01L 2224/48175* (2013.01); *H01L 2224/48195* (2013.01); *H01L 2224/49175* (2013.01); *H01L 2924/00014* (2013.01)

(58) Field of Classification Search
CPC ......... H01L 23/66; H01L 24/48; H01L 24/49; H01L 23/047; H01L 2223/665; H01L 2224/47175; H01L 2224/48195
See application file for complete search history.

(56) References Cited

U.S. PATENT DOCUMENTS

| 5,663,597 A * | 9/1997 | Nelson ............ H01L 23/49541 257/676 |
| 6,734,728 B1 | 5/2004 | Leighton et al. |
| 8,638,171 B2 | 1/2014 | Blednov et al. |
| 9,734,728 B2 * | 8/2017 | Feyereisen ........... G08G 5/0021 |
| 2005/0200425 A1 * | 9/2005 | McKay ..................... H01P 5/10 333/26 |
| 2007/0071045 A1 * | 3/2007 | Hayashi .................. H01S 5/042 372/38.1 |
| 2012/0146723 A1 * | 6/2012 | Blednov ................. H01L 23/66 330/192 |
| 2016/0373085 A1 * | 12/2016 | Barbieri .................. H01L 23/13 |

OTHER PUBLICATIONS

Pang et al; "Design of a Post Matching Asymmetric Doherty Power Amplifier for Broadband Applications"; IEEE Microwave and Wireless Components Letters, vol. 26, No. 1; 3 pages (Jan. 2016).

(Continued)

*Primary Examiner* — Robert K Carpenter

(57) ABSTRACT

A lead, for a packaged transistor device, having a signal portion and a bias line portion, with the signal portion and the bias line portion each having a proximal end and a distal end. The signal portion and the bias line portions of the lead are integrally formed together as a single conductive component, with the proximal end of the bias line portion integrated into the signal portion of the lead and with the distal ends of the signal portion and the bias line portion physically separate from each other.

25 Claims, 9 Drawing Sheets

(56) References Cited

OTHER PUBLICATIONS

Gu et al; "Dual-Band GaN Power Amplifiers with Novel DC Biasing Networks Incorporating Offset Double-Sided Parallel Strip Line"; IET Microwaves, Antennas & Propagation, vol. 10, Issue 3; 5 pages (Feb. 2016).
Infineon: "PTFB093608FV—Thermally-Enhanced High Power RF LDMOS FET 306 W, 28 V, 920-960 MHz Data Sheet, Rev. 05"; 13 pages (Oct. 6, 2015).
Infineon; "PXAD184218FV—Thermally-Enhanced High Power RF LDMOS FET 420 W, 28 V, 1805-1880 MHz Data Sheet, Rev. 02.1"; 9 pages (Dec. 7, 2016).
Infineon: "PXAC180602MD—Thermally-Enhanced High Power RF LDMOS FET 60 W, 28 V, 1805-1880 MHZ Data Sheet, Rev 02.1"; 10 pages (Jun. 18, 2015).
Ampleon; "BLP10H630P Power LDMOS Transistor, Data Sheet, Rev 1"; 15 pages (Dec. 20, 2016).
Ampleon; "BLF6G15L-500H, Power LDMOS transistor, Rev. 4, Data Sheet"; 13 pages (Sep. 1, 2015).
Qorvo; "QPD1016—Product Overview, Rev. A"; 25 pages (Dec. 16, 2016).
TriQuint (Qorvo); "T1G402003-FS Data Sheet, Rev C"; 21 pages (May 12, 2015).

\* cited by examiner

INTEGRALLY FORMED BIAS AND SIGNAL LEAD FOR A PACKAGED TRANSISTOR DEVICE

FIELD

The present disclosure relates generally to packaged semiconductor devices and more particularly to leads of packaged transistor devices with an applied bias voltage.

BACKGROUND

There is demand for shrinking the dimensions of currently implemented radio frequency (RF) amplifiers, such as Doherty amplifiers. This market pressure partially derives from a desire to fit full multiband amplifier designs on single palettes. Unfortunately, lack of sufficient space has led to the fabrication and implementation of non-ideal amplifiers, amplifiers for which compromises and tradeoffs to work within limited spaces has brought about poor design practices.

In one scenario, manufacturers must trade of limited physical printed circuit board (PCB) space for proper or acceptable RF performance. Giving higher priority to the RF section of a PCB layout, for example, can result in a non-ideal implementation of bias lines. This, in turn, diminishes important parameters such as the maximum video bandwidth (VBW) amplifiers are capable of, making it a challenge for the manufactures to pass their respective digital pre-distortion (DPD) corrections tests.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Figure 1:
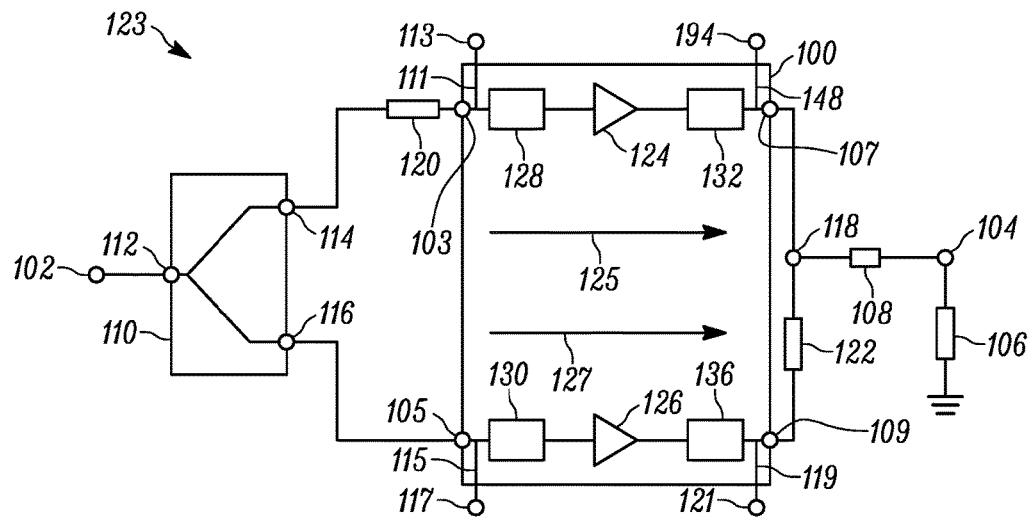
FIG. 1 shows a block diagram of an RF amplifier with two amplifier pathways, in accordance with some embodiments.

The present disclosure is illustrated in part with examples, as reflected by disclosed embodiments, and is not limited by the accompanying figures, in which like reference numbers indicate similar elements. Skilled artisans will appreciate that elements in the figures are illustrated for simplicity and clarity and have not necessarily been drawn to scale. For example, the dimensions of some of the elements in the figures may be exaggerated relative to the dimensions of other elements to help to improve understanding of embodiments implicitly or explicitly disclosed herein.

The apparatus components have been represented, where appropriate, by conventional symbols in the drawings, showing only those specific details that are pertinent to understanding the embodiments of the present disclosure so as not to obscure the disclosure with details that will be readily apparent to those of ordinary skill in the art having the benefit of the description herein.

DETAILED DESCRIPTION

Described embodiments are directed to a signal input and/or output lead for a packaged transistor device with the lead having an integrated bias line portion to feed the packaged transistor device a bias voltage. A single conductive lead with integrated signal and bias line portions, for example, can handle greater currents and allow for a wider baseband bandwidth when used on the output side of a packaged high-power transistor device as compared to using separate leads for the signal and the bias voltage. By shaping the bias line portion of the integrated lead, a radio frequency (RF) short typically implemented a quarter wavelength from the packaged transistor device can be brought physically closer to the device, thus making more efficient use of limited printed circuit board (PCB) space.

In accordance with one embodiment, a packaged transistor device includes a device package having an interior and a perimeter with a transistor die within the interior of the device package. The packaged transistor device further includes a lead extending from the interior of the device package past the perimeter, wherein the lead is electrically coupled to the transistor die. The lead includes a signal portion and a bias line portion. The signal portion of the lead has a proximal end and a distal end, and the bias line portion of the lead has a proximal end and a distal end. The signal portion and the bias line portion are integrally formed together as a single conductive component with the distal ends of the signal portion and the bias line portion being physically separate from each other.

In accordance with another embodiment, a lead for a packaged transistor device includes a signal portion having a proximal end and a distal end in addition to a bias line portion having a proximal end and a distal end. The signal portion and the bias line portion are integrally formed together as a single conductive component, with the proximal end of the bias line portion integrated into the signal portion of the lead and with the distal ends of the signal portion and the bias line portion physically separate from each other.

In accordance with an additional embodiment is an amplifier with a packaged transistor device that includes a transistor die and a lead extending from the packaged transistor device. The lead is electrically coupled to the transistor die and includes a signal portion and a bias line portion. The signal portion of the lead has a proximal end and a distal end, and the bias line portion of the lead has a proximal end and a distal end. The signal portion and the bias line portion are integrally formed together as a single conductive component, and the distal end of the signal portion and the distal end of the bias line portion are physically separate from each other.

For one embodiment, the proximal end of the signal portion is electrically connected to a terminal of the transistor die selected from a control terminal and a current conducting terminal and the distal end of the signal portion is electrically connected to a conductive trace on a substrate to which the packaged transistor device is mounted. In another embodiment, the proximal end of the bias line portion is integrated into the signal portion of the lead and the distal end of the bias line portion is electrically connected to a fixed-voltage conductive trace on the substrate.

A packaged transistor device, also referred to herein simply as a device, is a semiconductor package, made from metal, plastic, glass, ceramic, and/or some other solid materials, which houses at least one transistor. Transistors within a package may be implemented on a die or integrated circuit (IC). In a number of embodiments, the transistors of a packaged transistor device function to amplify a signal. For some of these embodiments, the signal is an RF signal. For particular embodiments, a packaged transistor device operates as a high-power RF amplifier.

An integrally formed lead, as referred to herein, is a lead for use with a packaged transistor device, wherein the lead has a signal portion and a bias line portion integrally formed together as a single conductive component. In various embodiments, an integrally formed lead can be an integrally formed input lead or an integrally formed output lead. Here, the words "input" and "output" describe the function of the signal portion of the integrally formed lead. The signal portion of an integrally formed input lead conducts a signal, such as an RF signal, to the packaged transistor device, while the bias line portion of the integrally formed input lead feeds a bias voltage or current to the packaged transistor device. The signal portion of an integrally formed output lead conducts a signal, such as an amplified RF signal, from the packaged transistor device, while the bias line portion of the integrally formed output lead feeds a bias voltage or current to the packaged transistor device. Use of the word "lead" herein refers to an integrally formed lead unless a standard lead is explicitly indicated. Further, as used herein, the term "integrally formed" means formed as a single piece. The term "integrally formed lead" means a lead that includes both a signal portion and a bias line portion that are integrally formed together as a one-piece article.

As used herein, a proximal end of a portion of a lead used in a packaged transistor device is the end of the lead portion that electrically connects or couples with the packaged transistor device. A distal end of the portion of the lead is the opposite end, which electrically connects or couples to an object with which the packaged transistor device is coupled.

Referring now to the drawings, FIG. 1 shows a block diagram of an RF amplifier 123 in accordance with some embodiments. In particular, the block diagram is a simplified representation of a Doherty amplifier 123 with two amplifier pathways and four integrally formed leads included in a packaged transistor device 100.

The amplifier 123 includes an input node 102, an output node 104, a power divider (or splitter) 110, a main amplifier path 125, a peaking amplifier path 127, and a combining node 118. A load 106 may be coupled to the combining node 118 through an impedance transformer 108, in an embodiment. The impedance transformer 108 may impart a 90 degree phase delay to the output RF signal before it is supplied to the load 106.

Essentially, the power divider 110 divides an input RF signal supplied at the input node 102, and the divided signals are separately amplified along the main 125 and peaking 127 amplifier pathways. The amplified signals are then combined in phase at the combining node 118. It is important that phase coherency between the main 125 and peaking 127 amplifier pathways is maintained across a frequency band of interest to ensure that the amplified main and peaking signals arrive in phase at the combining node 118, and thus to ensure proper Doherty amplifier operation.

Each of a main amplifier 124 and a peaking amplifier 126 includes one or more single stage or multiple-stage power transistor ICs for amplifying an RF signal conducted through the amplifiers 124, 126. Although the main and peaking power transistor ICs may be of equal size (e.g., in a symmetric Doherty configuration), the main and peaking power transistor ICs may have unequal sizes, as well (e.g., in various asymmetric Doherty configurations).

During operation of the amplifier 123, main amplifier stage 124 is biased to operate in class AB mode, and peaking amplifier stage 126 is biased to operate in class C mode. More specifically, the transistor arrangement of the main amplifier stage 136 is biased to provide a conduction angle of between 180 and 360 degrees. Conversely, the transistor arrangement of the peaking amplifier stage 126 is biased to provide a conduction angle of less than 180 degrees.

At low power levels, where the power of the input signal at the node 102 is lower than the turn-on threshold level of the peaking amplifier 126, the amplifier 123 operates in a low-power (or back-off) mode in which the main amplifier 124 is the only amplifier supplying current to the load 106. When the power of the input signal exceeds a threshold level of the peaking amplifier 126, the amplifier 123 operates in a high-power mode in which the main amplifier 124 and the peaking amplifier 126 both supply current to the load 106. At this point, the peaking amplifier 126 provides active load modulation at the combining node 118, allowing the current of the main amplifier 124 to continue to increase linearly.

Input 128 and output 132 impedance matching networks may be implemented at the input and/or output of the main amplifier 124. Similarly, input 130 and output 136 impedance matching networks may be implemented at the input and/or output of the peaking amplifier 126. In each case, the matching networks 128, 132, 130, 136 may be used to incrementally increase the circuit impedance toward the source impedance on the input side of the main 124 or peaking 126 amplifier and toward the load impedance on the output side of the main 124 or peaking 126 amplifier. In addition, the main amplifier 124 and the peaking amplifier 126 may have additional pre-matching input and/or output impedance matching networks (not pictured) that are either integrated with the power transistor dies, or integrated within power transistor die packages. Further still, each of the main and peaking amplifiers 124, 126 may be implemented as a single stage amplifier (e.g., each including a single power transistor), or as a multiple stage amplifier (e.g., each including a driver-stage transistor and a finalstage transistor coupled in series, with an inter-stage impedance matching network electrically coupled between the stages).

The Doherty amplifier 123 has an "inverted" load network configuration, as compared to a non-inverted Doherty amplifier. In the inverted configuration, the input circuit is configured so that an input signal supplied to the main amplifier 124 is delayed by 90 degrees with respect to the input signal supplied to the peaking amplifier 126 at the center frequency of operation, $f_c$, of the amplifier 123. The 90 degree differential delay in the input circuit between the main 125 and peaking 127 pathways may be imparted by a 90 degree phase delay element 120 in the main amplifier pathway 125. Alternatively, the power divider 110 and the phase delay element 120 may be replaced with a hybrid power splitter, which outputs main and peaking signals with the desired 90 degree phase difference.

The power divider 110 is configured to divide the input power of an input signal received at an input 112 of the power splitter 110 into main and peaking portions of the input signal. The main input signal is provided to the main amplifier pathway 125 at an output 114 of the power divider 110, and the peaking input signal is provided to the peaking amplifier pathway 127 at an output 116 of the power divider 110. During operation in a full-power mode when both the main 124 and peaking 126 amplifiers are supplying current to the load 106, the power divider 110 divides the input signal power between the amplifier pathways 125, 127. For example, the power divider 110 may divide the power equally, such that roughly one half of the input signal power is provided to each pathway 125, 127 (e.g., for a symmetric Doherty amplifier configuration). Alternatively, the power divider 110 may divide the power unequally (e.g., for an asymmetric Doherty amplifier configuration).

To ensure that the main and peaking input RF signals arrive at the main 124 and peaking 126 amplifiers with about 90 degrees of phase difference, as is fundamental to proper Doherty amplifier operation, the phase delay element 120 applies about 90 degrees of phase delay to the main input signal. For example, the phase delay element 120 may be a quarter wave transmission line, or another suitable type of delay element with an electrical length of about 90 degrees.

In accordance with the principles of operation of the "inverted" Doherty amplifier 123 and in order to establish the correct load modulation characteristic, the main output pathway including the output matching network 132 plus any output pre-match within the main amplifier device 124, is configured to impart a total phase delay of about 90 degrees, and the peaking output pathway including a delay element 122 plus the output matching network 136 and any output pre-match within peaking amplifier device 126, is configured to impart a total phase delay of about 180 degrees. The main output pathway 125 including output matching network 132 plus any output pre-match within main amplifier device 124 is configured to impart a total phase delay of about 90 degrees to ensure that the main output pathway operates as an impedance inverter. Essentially, the main output pathway is configured to appear as a voltage source as seen from the combining node 118. The delay element 122 plus the output matching network 136 and any output pre-match within peaking amplifier device 126 is configured to impart a total phase delay of about 180 degrees to ensure that the peaking output pathway appears as a current source as seen from the combining node 118. This is also important in order to maximize the impedance looking into the peaking pathway output from the combining node 118 to minimize undesirable loading of the main path during low-power (or back-off) mode.

To compensate for the resulting 90 degree phase delay difference between the main 125 and peaking 127 amplifier pathways at the outputs of the main 124 and peaking 126 amplifiers, respectively (i.e., to ensure that the amplified signals arrive in phase at the combining node 118), the input circuit includes the phase delay element 120, which is consequently configured to apply about a 90 degree phase delay to the signal at the input of main amplifier 124.

The main 124 and peaking 126 amplifier, in addition to the input 128, 139 and output 132, 136 impedance matching networks, are shown as part of the packaged transistor device 100. Also part of the packaged transistor device 100 are four integrally formed leads, each having a bias line portion 111, 148, 115, 119 explicitly shown in FIG. 1. A distal end 113, 194, 117, 121 of the bias line portion of each lead extends beyond a perimeter of the packaged transistor device 100 and is indicated with a node circle. These distal ends 113, 194, 117, 121 are connected to external bias voltage or current supplies that feed the packaged transistor device 100.

As shown, the Doherty amplifier 123 has two integrally formed leads for each of its two amplifier pathways 125, 127 passing through the packaged transistor device 100. The main amplifier pathway 125, for example, has an integrally formed input lead, represented by input signal node 103 and the bias line portion 111, at the pathway 125 input to the packaged transistor device 100. The main amplifier pathway 125 also has an integrally formed output lead, represented by output signal node 107 and the bias line portion 148, at the pathway 125 output from the packaged transistor device 100. Similarly, the amplifier pathway 127 has an integrally formed input lead, represented by input signal node 105 and the bias line portion 115, on an input side of the packaged transistor device 100 and an integrally formed output lead, represented by output signal node 109 and the bias line portion 119, on an output side of the packaged transistor device 100.

For other embodiments, each of any number of amplifier pathways passing through a packaged transistor device can independently include an integrally formed input and/or output lead. A subset of the amplifier pathways passing through a packaged transistor device can also be implemented without an integrally formed lead that includes both a bias line portion and a signal portion.

Figure 2:
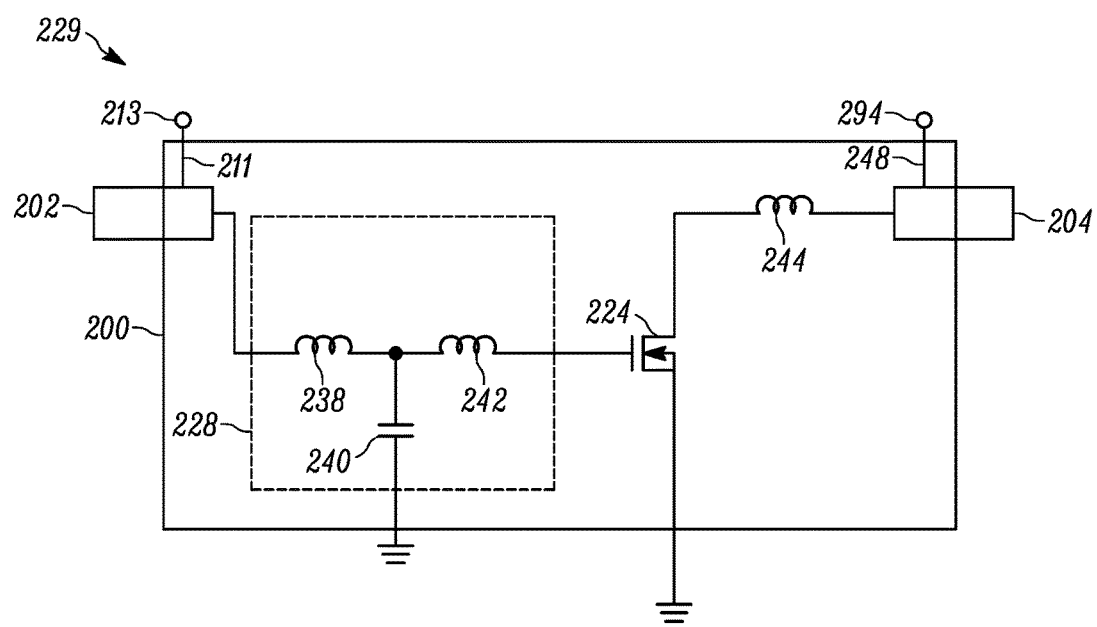
FIG. 2 shows a schematic diagram of a single amplifier pathway within a packaged transistor device for an RF amplifier, in accordance with some embodiments.

FIG. 2 shows a schematic diagram of a single amplifier pathway 229 within a packaged transistor device 200 for an RF amplifier. At an input side of the device 200 is an integrally formed input lead having a signal portion 202 and bias line portion 211. The input lead extends from inside the device 200 to outside the device 200. Thus, the proximal end of the signal portion and the proximal end of the bias line portion of the input lead are both located inside the perimeter of the device 200. The distal end of the signal portion and the distal end 213 of the bias line portion of the input lead are both located outside the perimeter of the device 200, allowing the distal ends of the signal portion and the bias line portion of the input lead to be coupled with external circuitry and/or connectors.

At an output side of the packaged transistor device 200 is an integrally formed output lead having a signal portion 204 and bias line portion 248. The output lead extends from inside the device 200 to outside the device 200. Thus, the proximal end of the signal portion and the proximal end of the bias line portion of the output lead are both located inside the perimeter of the 200. The distal end of the signal portion and the distal end 294 of the bias line portion of the output lead are both located outside the perimeter of the packaged transistor device 200, allowing the distal ends of the signal portion and the bias line portion of the output lead to be coupled with external circuitry and/or connectors.

Shown inside the packaged transistor device 200 is a transistor 224 representing a primary active component of the device 200. The transistor 224 includes a control terminal and two current conducting terminals, where the current conducting terminals are spatially and electrically separated by a variable-conductivity channel. For example, transistor 224 may be a field effect transistor (FET) (such as a metal oxide semiconductor FET (MOSFET)), which includes a gate (a control terminal), a drain (a first current conducting terminal), and a source (a second current conducting terminal). Alternatively, transistor 224 may be a bipolar junction transistor (BJT). Accordingly, references herein to a "gate," "drain," and "source," are not intended to be limiting, as each of these designations has analogous features for a BJT implementation (e.g., a base, collector, and emitter, respectively). For various embodiments, the transistor 224 represents multiple transistors, such as a plurality of transistors located on a transistor die. For a particular embodiment, the bias line portion 211 of the input lead provides a first direct current (DC) voltage to the gate terminal of the transistor(s) 224, and the bias line portion 248 of the output lead provides a second DC voltage to the drain terminal of the transistor(s) 224.

Coupled between the input lead and the transistor(s) 224 is an input impedance matching circuit 228. The input impedance matching circuit 228 is configured to raise the impedance of device 200 to a higher intermediate impedance level (e.g., in a range from about 2 to about 10 Ohms or higher). This is advantageous in that it allows a PCB-level matching interface from a driver stage to have an impedance that can be achieved in high-volume manufacturing with minimal loss and variation (e.g., a "user friendly" impedance matching interface).

Specifically, the input impedance matching circuit 228 is coupled between the proximal end of the signal portion 202 of the input lead and the gate terminal of the transistor(s) 224. As shown, the input impedance matching circuit 228 includes two inductive elements 238, 242 and a shunt capacitor 240. A first inductive element 238, representing a first set of one or more bondwires, is coupled between the input lead 202 and a first terminal of the capacitor 240. A second inductive element 242, representing a second set of one or more bondwires, is coupled between the first terminal of the capacitor 240 and the control terminal of the transistor(s) 224. A second terminal of the capacitor 240 is coupled to ground or another common voltage reference.

The combination of the inductive elements 238, 242 and the capacitor 240 functions as a low-pass filter. In accordance with some embodiments, the series combination of the inductive elements 238, 242 may have an inductance value in a range of between about 50 picohenries (pH) to about 3 nanohenries (nH). The shunt capacitor 240 may have a capacitance value in a range of between about 5 picofarads (pF) to about 80 pF.

Coupled between the drain terminal of the transistor(s) 224 and the proximal end of the signal portion 204 of the integrally formed output lead is an inductor 244, which represents a third set of one or more bondwires. The source terminal of the transistor(s) 224 is shown connected to ground or another common voltage reference. Absent from the packaged transistor device 200, as illustrated, is an output impedance matching circuit. The transistor(s) 224, for example, is a gallium nitride (GaN) transistor(s) (or other transistor with relatively low parasitic output capacitance), which may or may not include an output impedance matching circuit. Alternatively, the transistor(s) 224 may be a laterally-diffused MOS (LDMOS) transistor(s) (or other transistor with relatively high parasitic output capacitance), which may be more inclined to benefit from an output impedance matching circuit. Also absent from the packaged transistor device 200, as illustrated, is a shunt DC blocking circuit and an envelope frequency termination circuit, either or both of which may be present for some embodiments.

Referring to both FIGS. 1 and 2, the bias line portions 111, 115, 211 of the input leads may be electrically coupled to external bias circuits to provide bias voltages to the control terminals (e.g., the gate terminals) of the amplifiers 124, 126, 224, and the bias line portions 148, 119, 248 of the output leads may be electrically coupled to external bias circuits to provide bias voltages to a current conducting terminal (e.g., the drain or source terminal) of the amplifiers 124, 126, 224. In some embodiments, a device may be configured so that bias voltages may be provided to both the control and current conducting terminals of the amplifiers 124, 126, 224, such as is illustrated in FIGS. 1 and 2. In other embodiments, a device may be configured so that bias voltages may be provided to either the control terminal or the current conducting terminal of the amplifiers 124, 126, 224, but not both. In such embodiments, an input or output lead that is not used to provide a bias voltage may be configured without a bias line portion.

Figure 3:
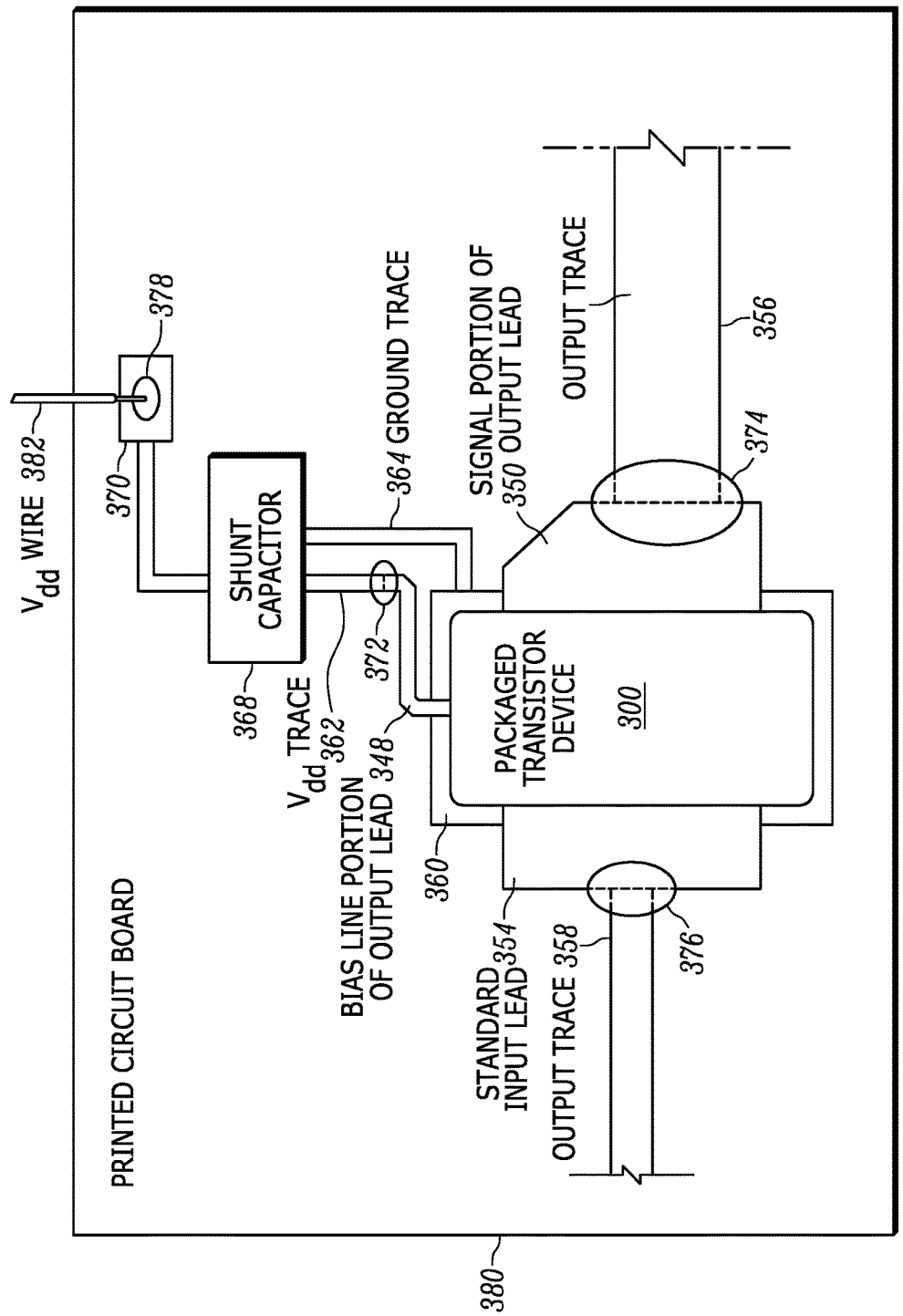
FIG. 3 shows a top view of a packaged transistor device on a printed circuit board, in accordance with some embodiments.

FIG. 3 shows a top view of a packaged transistor device 300 attached to a printed circuit board (PCB) 380, which in other embodiments may be a different type of substrate to which the device 300 is attached. For one embodiment, the device 300 represents the packaged transistor device 200 with a standard input lead 354 (i.e., a lead without an integrally formed bias line portion) rather than an integrally formed input lead. In various embodiments, either or both of the leads for the single-pathway device 300 are integrally formed leads. Ovals appearing in FIG. 3 represent solder connections (e.g., between the leads and conductive traces 356, 358, 362 on the PCB 380).

The packaged transistor device 300 is mounted to an electrically and thermally conductive feature 360 of the PCB 380, which grounds the device 300 or electrically couples the device 300 with a common reference voltage on the PCB 380. The standard input lead 354 is shown soldered 376 to an input trace 358 on the PCB 380, enabling an input signal, such as an RF signal, to be transmitted to the packaged transistor device 300. Extending beyond a perimeter of the device 300 on the output side of device 300 is a signal portion 350 of the integrally formed output lead. The distal end of the signal portion is shown soldered 374 to an output trace 356 on the PCB 380, enabling an output signal, such as an amplified RF signal, to be transmitted from the packaged transistor device 300 to a jack or other form of connector that interfaces with an external component.

Also shown extending beyond the perimeter of the packaged transistor device 300 is a bias line portion 348 of the integrally formed output lead. The integration of the bias line portion 348 and the signal portion 350 of the output lead is within the packaged transistor device 300 and is not visible in FIG. 3. Complete views of integrally formed leads are shown in the remaining figures.

A distal end of the bias line portion 348 of the output lead is shown soldered 372 to a first end of a trace 362 which supplies a bias voltage to the bias line portion 348. As shown, the bias voltage is a positive voltage $V_{dd}$ applied to the drain of the packaged transistor device 300. In other embodiments, the bias voltage may be a negative or positive voltage applied via a bias line portion of an integrally formed lead to the gate, source, and/or drain of a packaged transistor device. A second end of the bias voltage trace 362 is shown to terminate at a conductive pad 370. A bias voltage supply wire 382, which may be connected to an external bias circuit, is soldered 378 to the conductive pad 370, thereby energizing the bias voltage trace 362.

A first end of a ground trace 364 is electrically connected to the feature 360 or otherwise coupled to ground. A second end of the ground trace 364 is electrically connected to a second terminal of a DC-blocking shunt capacitor 368, with a first terminal of the shunt capacitor 368 being electrically connected to the bias voltage trace 362. For various embodiments, the shunt capacitor 368, or a DC-blocking shunt capacitor bank represented by the capacitor 368, shorts RF energy leaking into the bias voltage trace 362 to ground.

To prevent, minimize, or reduce RF energy from leaking into the bias voltage trace 362 and entering biasing circuitry, a combined electrical length of the bias line portion 348 of the output lead plus the portion of the bias voltage trace 362 between the distal end of the bias line portion 348 of the output lead and the first terminal of the shunt capacitor 368 is substantially a quarter wavelength of the fundamental operating frequency of the packaged transistor device 300. Where the packaged transistor device 300 operates across a range or band of frequencies, the combined electrical length is substantially a quarter wavelength of the center frequency, $f_c$, of the band or range of operating frequencies. A fundamental frequency, as used herein, refers to the center frequency of a periodic waveform that includes multiple frequency components.

A physical length, as used herein, is a length measured and/or identified by a fixed unit scale. A physical length, for example, can be measured and/or identified in units of microns or mils. An electrical length, as used herein, is a length measured and/or identified in terms of a wavelength of a specified frequency of operation for a packaged transistor device. An electrical length can also be measured and/or identified in terms of an angle where 360 degrees or $2\pi$ radians represents a full wavelength at the specified frequency. The word "substantially," as used herein, means within plus or minus ten percent of an identified target value.

With a combined electrical length of substantially a quarter wavelength of the operating frequency of the device 300 between the proximal end of the bias line portion 348 and the first terminal of shunt capacitor 368, the bias network appears as an open circuit or represents a very high impedance to an RF signal at the operating frequency, blocking or resisting the RF signal from entering the bias line portion 348 of the output lead. For embodiments where a packaged transistor device has an integrally formed input lead, a combined electrical length of the bias portion of the input lead plus a bias voltage trace between the distal end of the bias portion of the input lead and a DC-blocking shunt capacitor or capacitor network is substantially a quarter wavelength of the operating frequency of the device.

While a combined electrical length of a quarter wavelength is ideal for isolation from RF energy, the combined electrical length of the bias line portion 348 of the output lead plus the bias voltage trace 362 between the distal end of the bias portion 348 of the output lead and the first terminal of the shunt capacitor 368 is less than a quarter wavelength for some embodiments. This allows for the placement of one or more low-frequency capacitors to be closer to the packaged transistor device 300 to help minimize distortions from an envelope current that is being modulated.

Figure 5:
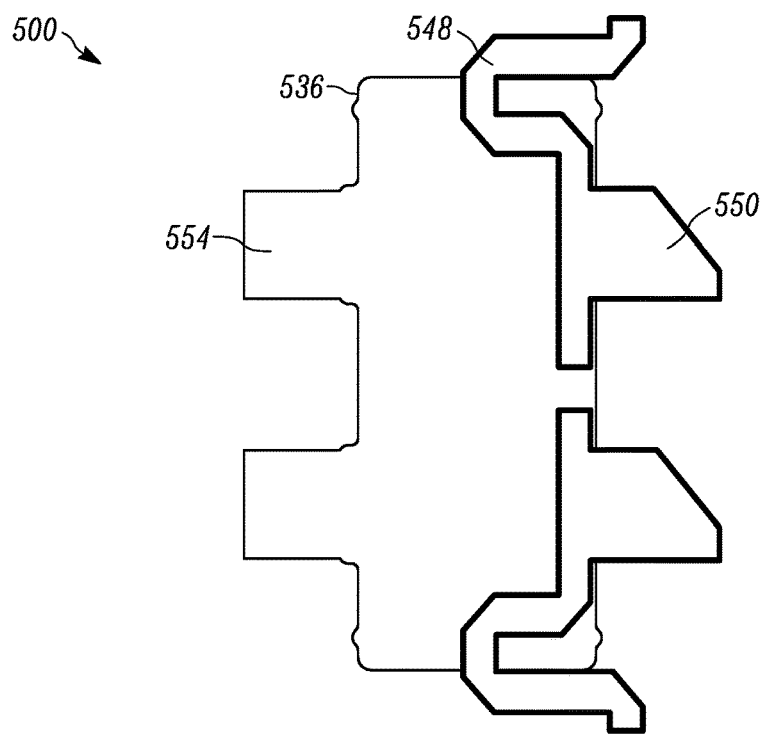
FIG. 5 shows a top view of a packaged transistor device with its cover removed, in accordance with some embodiments.
Figure 6:
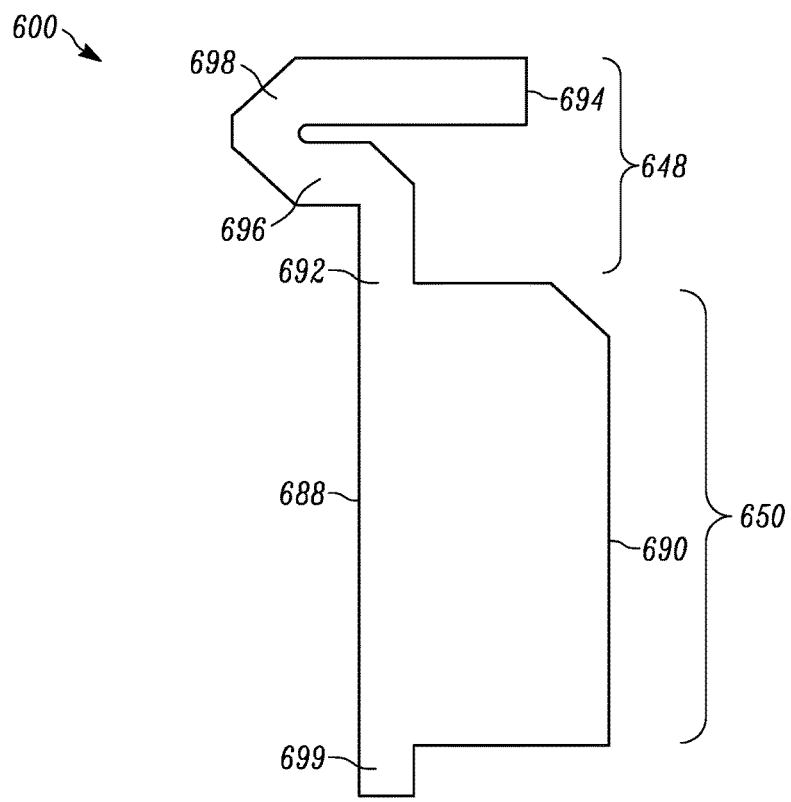
FIG. 6 shows a top view of a lead for a packaged transistor device, in accordance with some embodiments.

Given a combined electrical length of substantially a quarter wavelength for a number of embodiments, the electrical length of just the bias line portion 348 of the output lead, as measured between the proximal and distal ends of the bias line portion 348 of the lead, is less than or equal to a quarter wavelength at the fundamental frequency at which the packaged transistor device 300 is designed to operate. In a number of embodiments, an electrical length of the bias line portion 348 is less than a quarter wavelength of a frequency within a range of 800 megahertz to 6.0 gigahertz, providing for a physical length of between approximately 50 to 1800 mils. In other embodiments, the physical length of the bias line portion of an integrally formed lead can be less than 50 mils or greater than 1800 mils. For some embodiments, the electrical length of the bias line portion of a lead is substantially equal to an eighth of a wavelength at the fundamental frequency of a packaged transistor device. Integrally formed leads with a bias line portion having an electrical length of substantially an eighth of a wavelength are shown in FIGS. 4-6.

Figure 4:
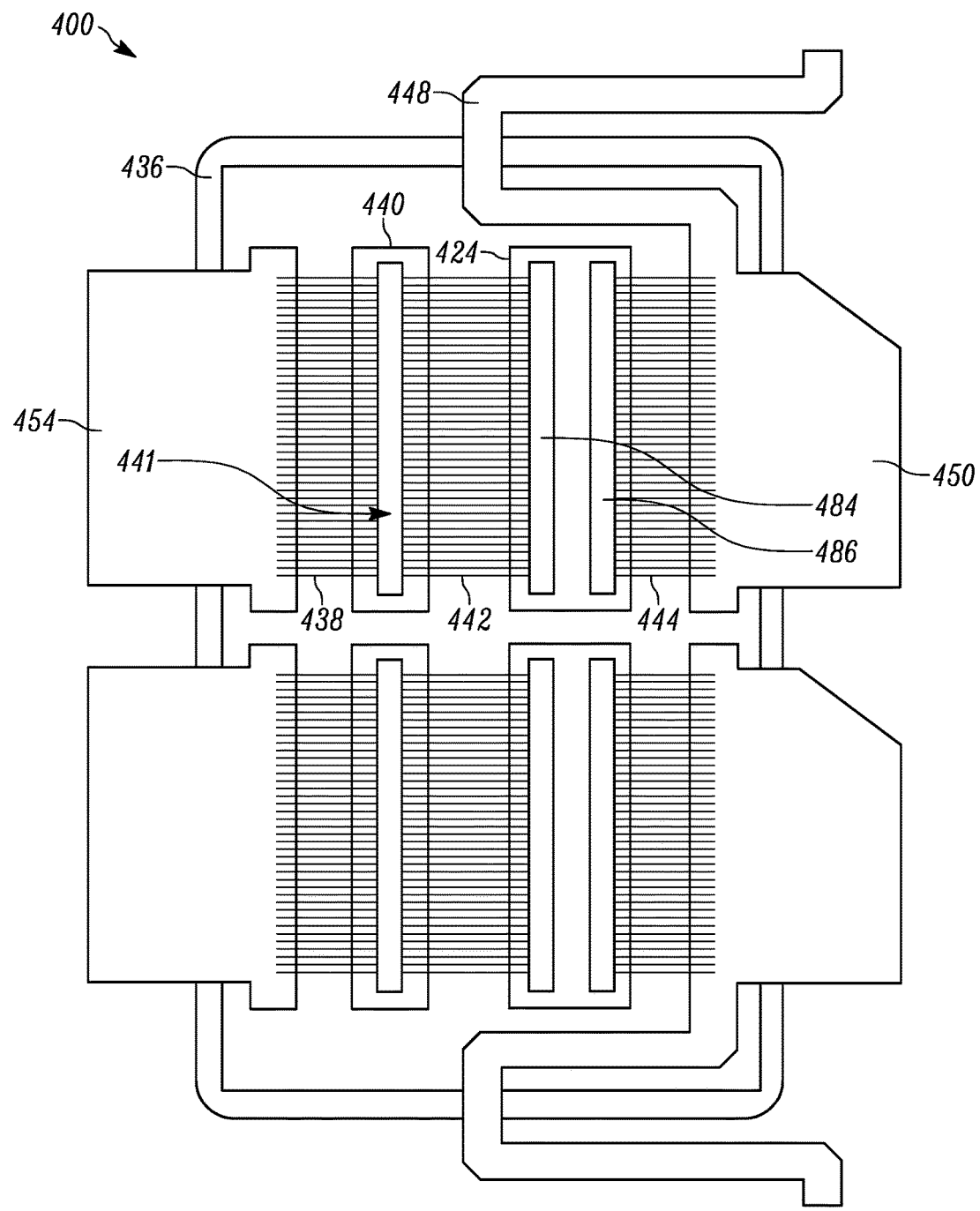
FIG. 4 shows a top view of a packaged transistor device with its cover removed, in accordance with some embodiments.

FIG. 4 shows a top view of a packaged transistor device 400 with its cover removed, providing a full view of integrally formed output leads with bias line portions having an electrical length of substantially an eighth of a wavelength ($\lambda/8$) of a fundamental operational frequency of device 400. As shown, the device 400 is a double-pathway device, used, for example, in the Doherty amplifier 123 of FIG. 1. In other embodiments, the device 400 can be a single-path device or have three or more pathways with different combinations of integrally formed input and output leads.

Describing the upper pathway of the packaged transistor device 400 by means of comparison to the schematic diagram of FIG. 2, the upper integrally formed output lead of the device 400 has a signal portion 450 and a bias line portion 448 that corresponds to the signal portion 204 and the bias line portion 248, respectively, of the integrally formed output lead of the device 200. The integrally formed input lead of the device 200 has been replaced by a standard input lead 354 for the packaged transistor device 400.

Figure 7:
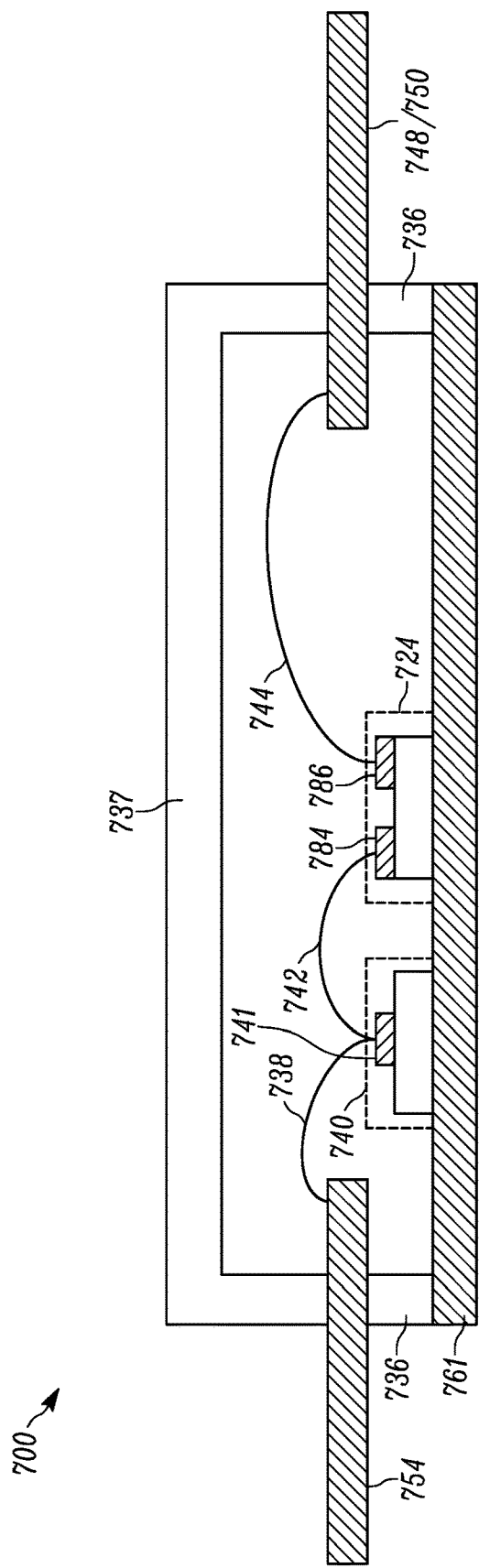
FIG. 7 shows a cross-sectional side view of a packaged transistor device, in accordance with some embodiments.

The various components of device 400 are mounted on and supported by a flange (e.g., flange 761, FIG. 7). For example, the flange may be formed from a solid conductive material (e.g., copper), or the flange may otherwise have a conductive top surface. The device flange may have a three-fold purpose. First, it is the substrate to which the device components are connected. Second, it may provide an electrical ground node for the device components. Third, it may function as a heat sink for the thermal energy generated by the device components (e.g., transistor die 424). The device flange typically is formed from a solid metal (e.g., copper) piece, and the device flange may define the perimeter of the device 400.

A capacitor 440, having a first terminal 441, and a transistor die 424, having a gate terminal 484 and a drain terminal 486, correspond to the capacitor 240 and the transistor(s) 224, respectively. A second terminal of the capacitor 440, which is connected to and thus grounded by the flange, is underneath the capacitor 440 and not visible in the top-down view provided by FIG. 4. Similarly, a source terminal of the transistor die 424 is electrically connected to and thus grounded by a conductive layer (not shown) connected to the bottom of the die 424.

Bonding wires 438 connecting the standard input lead 454 to the first terminal 441 of the capacitor 440 correspond to the inductor 238 shown in FIG. 2. Bonding wires 442 connecting the first terminal 441 of the capacitor 440 to the gate terminal 484 of the transistor die 424 correspond to the inductor 242 shown in FIG. 2. Bonding wires 444 connecting the drain terminal 486 of the transistor die 424 to the signal portion of the upper integrally formed output lead correspond to the inductor 244 shown in FIG. 2.

For various embodiments, an integrally formed lead is coupled to a current conducting terminal of a transistor die, such as to the source or drain terminal of the transistor die. The signal portion of the lead is an RF signal output portion of the lead, and the bias line portion of the lead is a fixed-voltage input portion of the lead. In FIG. 4, for instance, the integrally formed lead is coupled to the drain terminal 486 through the bonding wires 444 so that the signal portion 450 of the lead is an RF signal output portion of the lead. The bias line portion 448 of the lead is a fixed-voltage input portion of the lead in that it feeds a constant DC voltage to the signal portion 450 of the lead, and therefore, to the drain terminal 486 of the transistor die 424 through the bonding wires 444. In another embodiment, the integrally formed lead is coupled to the source terminal of the transistor die 424, and the drain terminal is grounded through the flange.

For other embodiments, an integrally formed lead is coupled to a control terminal of a transistor die, such as to the gate terminal 484 of the transistor die 424, for example. In such a case, the signal portion of the integrally formed lead is an RF signal input portion of the lead, and the bias line portion of the lead is a fixed-voltage input portion of the lead in that it feeds a constant DC voltage to the signal portion of the lead, and therefore, to the gate terminal of the transistor die (e.g., through the bonding wires 438 and 442).

An isolation structure 436 of the packaged transistor device 400 is indicated with parallel lines indicating a width of the isolation structure 436. The isolation structure 436 is mounted to the top surface of the flange, and serves to elevate and electrically isolate the leads 454, 448/450 from the conductive top surface of the flange. The outside of the isolation structure 436 defines a perimeter for the device 400. Device 400 corresponds to an air-cavity package (e.g., including a cover 737 and an enclosed air cavity, as depicted in FIG. 7). In alternate embodiments, device 400 may be an overmolded package, in which an encapsulant material (e.g., a plastic encapsulant) holds the leads 454, 448/450 and flange in a fixed orientation relative to each other, and provides for electrical isolation of the leads 454, 448/450 from the flange. In such embodiments, isolation structure 436 may be excluded. In either the air-cavity or overmolded package embodiments, the set of leads 454, 448/450 for each device may form portions of a leadframe (e.g., a stamped or laser-cut metal sheet that includes leads coupled to sacrificial features), and after assembly of the leads 454, 448/450 with other portions of the device, the leads 454, 448/450 may be singulated from the leadframe.

In FIG. 5, which is a simplified depiction of device 400, a shape, orientations, and positions for two integrally formed output leads are shown relative to a perimeter 536 of a packaged transistor device 500. Labeled for the uppermost output lead are a signal portion 550 and a bias line portion 548. As illustrated, the perimeter 536 is shown to include two standard input leads, the uppermost standard input lead 554 being labeled.

For various embodiments, at least a section of a bias line portion of an integrally formed lead runs parallel to an outside edge of a perimeter of a packaged transistor device. In further embodiments, part of the bias line portion of the integrally formed lead that runs parallel to the outside edge of the packaged transistor device is located inside of an enclosure for the packaged transistor device (e.g., inside the perimeter of the packaged transistor device). In FIG. 4, for example, the bias line portion 448 of the integrally formed output lead has a "horseshoe" shape which opens toward the output side (to the right, as shown) of the packaged transistor device 400. This shape is made up of two substantially straight horizontal sections, an upper horizontal section and a lower horizontal section, connected by a substantially vertical section on the left. The descriptive terms "horizontal" and "vertical" are used herein to indicate an orientation with respect to a view provided in one or more figures and not necessarily with respect to gravity. For different embodiments, the substantially vertical section can be straight (as shown), curved, or curved and straight in different places. Both horizontal sections run parallel to the horizontal portion of the perimeter of the packaged transistor device 400. The upper horizontal section runs parallel to the horizontal upper portion of the isolation structure 436 on the outside of the packaged transistor device 400, while the lower horizontal section runs parallel to the horizontal upper portion of the isolation structure 436 on the inside of the device 400.

FIG. 5, shows the upper horizontal section of the horseshoe-shaped bias line portion 448 of the upper integrally formed output lead running closer to the perimeter 536 of the packaged transistor device 500 as compared to the spatial relationship shown for FIG. 4. For some embodiments, the upper, lower, or both of the substantially straight horizontal sections of a horseshoe-shaped bias line portion of an integrally formed input or output lead can run parallel to a perimeter of a packaged transistor device with virtually no intermediary gap, as shown for the upper substantially straight horizontal section of the upper output lead of FIG. 5. In other embodiments, either or both of the substantially straight horizontal sections of the bias line portion of a lead can be a vertical distance away from the perimeter of a packaged transistor device by less than, the same as, or more than a width of the bias line portion. Embodiments can also include one or more substantially straight sections of a bias line portion of an integrally formed lead running at one or more angles with respect to the perimeter of a packaged transistor device. The horseshoe shape of the bias line portion 548, for example, can resemble a greater-than symbol (e.g., "<") or the letter "v" rotated clockwise by 90 degrees.

Geometric features of integrally formed leads are further described with respect to FIG. 6, which shows a top view of an integrally formed output lead 600 for a packaged transistor device. According to an embodiment, lead 600 is formed (e.g., stamped or laser-cut) from a metal sheet. Typically, the lead 600 forms a portion of a leadframe, as described above. For example, the metal sheet may be formed from copper, a copper alloy, an iron-nickel alloy (e.g., alloy 42), or another suitable metal. The metal sheet (and thus the lead 600) may have a thickness, for example, in a range of about 6 mils to about 10 mils (e.g., about 8 mils), although the sheet (or lead 600) may be thinner or thicker, as well. All or portions of the lead 600 may be plated, for example with nickel or other suitable plating materials, to facilitate attachment of bonding wires and/or coupling of the leads to traces on a PCB using solder or other materials.

The lead 600 has a signal portion 650, with a proximal end 688 and a distal end 690, plus a bias line portion 648, also having a proximal end 692 and a distal end 694. The distal end 690 of the signal portion 650 is physically separate from the distal end 694 of the bias line portion 698. Upper and lower substantially straight horizontal sections of the bias line portion 648 of the lead 600 are shown at 698 and 696, respectively. The proximal end 692 of the bias line portion 648 of the lead 600 is integrated with the signal portion 650 of the lead 600. In other words, the bias line portion 648 and the signal portion 650 are integrally formed as a single article (e.g., a single piece of metal singulated from a leadframe).

The signal portion 650 of the lead 600 further includes an edge extending between the proximal 688 and distal 690 ends of the signal portion 650, wherein the edge is partially defined by a length dimension (i.e., the distance between the proximal 688 and distal 690 ends). The bias line portion 648 of the lead 600 is partially defined by a length dimension that extends between the proximal 692 and distal 694 ends of the bias line portion 648. For example, the length of the signal portion 650 is measured in the direction of signal propagation and the length of the bias line portion 648 is measured in the direction of current flow.

The signal portion 650 is further defined by a width dimension that is perpendicular to its length dimension, and the bias line portion 648 is further defined by a width dimension that is perpendicular to its length dimension. In the embodiment pictured, the width dimension of the bias line portion 648 is substantially smaller than the length dimension of the edge of the signal portion 650 of the lead 600. For a number of embodiments, the bias line portion 648 is narrower than the signal portion 650 is long, either where the bias line portion 648 integrates with the signal portion 650 and/or along the entire length of the bias line portion 648. For example, according to various embodiments, the signal portion 650 has a length in a range of about 150 mils to about 275 mils and a width in a range of about 400 mils to about 460 mils. The bias line portion 648 has a length in a range of about 500 mils to about 750 mils, and a width in a range of about 50 mils to about 80 mils. In other embodiments, the dimensions of the signal and bias line portions 650, 648 may be less than and/or greater than the above-listed ranges.

In the pictured embodiment, the bias line portion 648 of the lead 600 also extends away from the signal portion 650 in a direction that is substantially perpendicular to an edge of the signal portion 650 defining the length of the signal portion 650. At the point of integration, where the proximal end 692 of the bias line portion 648 meets the signal portion 650, the length of the bias line portion 648 and the length of the signal portion 650 are orientated substantially perpendicular to one another. Although the proximal end 692 of the bias line portion 648 is shown to be connected to the proximal end 688 of the signal portion 650 along the edge of the signal portion 650, the proximal end 692 of the bias line portion 648 may be connected to the edge of the signal portion 650 at a location that is further toward the distal end 690 of the signal portion 650, in other embodiments.

For the pictured embodiment, as well as in other embodiments, the bias line portion 648 includes one or more bends along its length dimension. In some embodiments, including for the pictured embodiment, at least one of the bias line 648 bends is a 90 degree bend. In FIG. 6, the bias line 648 more specifically includes three 90 degree bends (one between the vertical portion and the lower horizontal portion, and two between the lower and upper horizontal portions, which could alternately be considered a 180 degree bend). A substantially vertical section of the bias line portion 648 of the lead 600, for example, connects the two substantially straight horizontal sections 696, 698. For the embodiments pictured in FIGS. 4 and 5, the bias line portions 448, 548 of the integrally formed leads have additional 90 degree bends just before the distal ends of the bias line portions. The orientation of the distal end of a bias line portion of a lead can facilitate the connection of the distal end of the bias line portion of the lead to a trace on a PCB, for instance. In other embodiments, bends along the length of the bias line portion of an integrally formed lead may have angle measures of less than or greater than 90 degrees.

The integrally formed lead 600 is shown with a lateral extension 699. The lateral extension 699 provides addition surface area on the proximal end of the lead 600 for the attachment of bondwires. The lateral extension shown for the upper output lead of FIG. 4, for example, allows additional bondwires to be attached to the signal portion 450 of the lead below the bondwires 444.

FIG. 7 shows a cross-sectional side view of a packaged transistor device 700 having at least one integrally formed lead. As pictured, the device 700 corresponds to a packaged transistor device like the device 400 of FIG. 4 but with its cover or cap in place and having only a single pathway. A cap 737, for example, meets with an isolation structure 736, which corresponds to the isolation structure 436 of the device 400. The device 700 includes an electrically and thermally conductive flange 761, which is connected to the conductive feature 360 of the PCB 380 shown in FIG. 3.

A capacitor 740, with a first terminal 741, and a transistor die 724, with a gate terminal 784 and a drain terminal 786, correspond to the capacitor 440, with a first terminal 441, and a transistor die 424, with a gate terminal 484 and a drain terminal 486, respectively. Wirebonds 738, 742, and 744 correspond to the wirebonds 438, 442, and 444, respectively. A standard input lead 754 and an integrally formed output lead having a signal portion 750 and a bias line portion 748 correspond to the standard input lead 454 and the integrally formed output lead having the signal portion 450 and the bias line portion 448, respectively.

As shown, the isolation structure 736 of the device 700 is coupled to the top surface of the flange 761, and the standard input lead 754 and an integrally formed output lead 748/750 are coupled to a top surface of the isolation structure 736 of the device 700. The cap 737 is then placed over the leads 754, 748/750 to form an air cavity within which the internal device components 740, 724, 738, 742, 744 are enclosed. The cap 737 allows for the leads 754, 748/750 to extend outside the perimeter of the isolation structure 736 to facilitate connection to traces on a PCB, such as the PCB 380. For some embodiments, the package 700 is recessed into a PCB, reducing or eliminating the need to bend the leads 754, 748/750 to achieve connections with traces on the PCB. In other embodiments, the leads 754, 748/750 may be bent downward so that the distal ends of the leads 754, 748/750 are parallel with the bottom surface of the flange 761. In such embodiments, the flange 761 and the leads 754, 748/750 are configured to be coupled to a top surface of the PCB.

Figure 9:
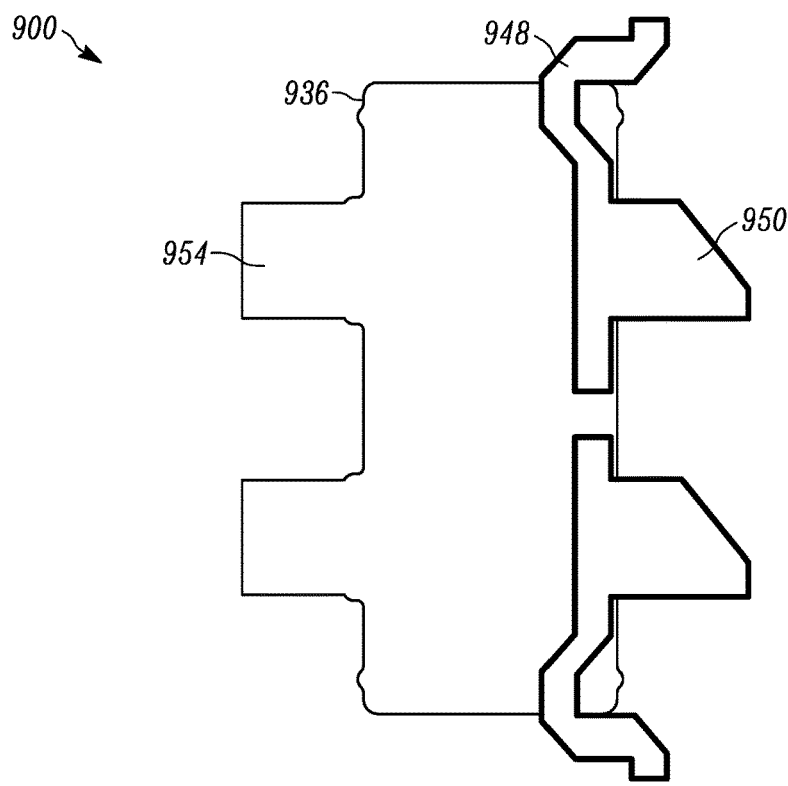
FIG. 9 shows a top view of a packaged transistor device with its cover removed, in accordance with some embodiments.
Figure 10:
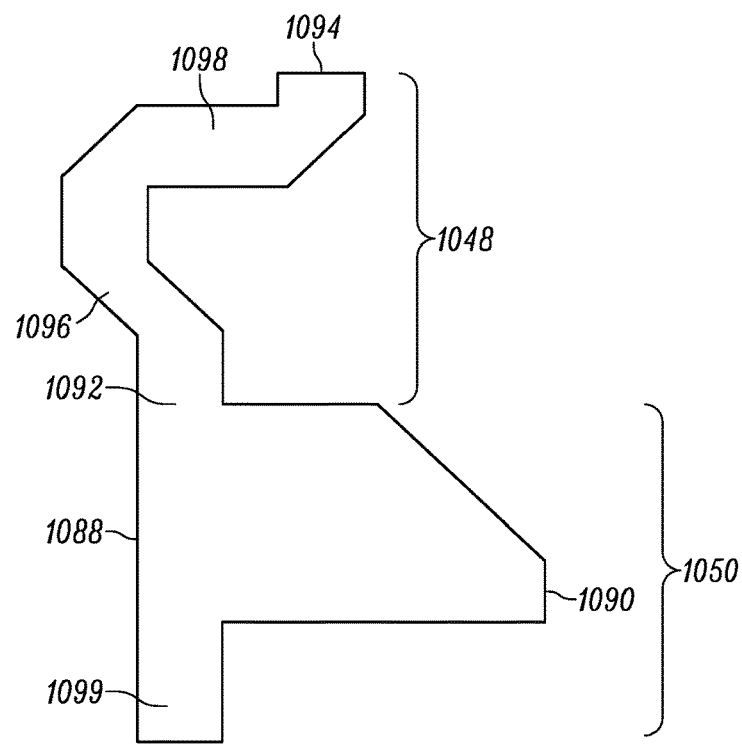
FIG. 10 shows a top view of a lead for a packaged transistor device, in accordance with some embodiments.

The above-described embodiments indicate that the bias line portion of a lead may be less than a quarter wavelength at the fundamental frequency of a packaged transistor device. For some embodiments, the electrical length of the bias line portion of a lead is substantially shorter, such as equal to about one eighth of a wavelength (as discussed in conjunction with FIGS. 4-6) or one sixteenth of a wavelength at the fundamental frequency of a packaged transistor device. Integrally formed leads with a bias line portion having electrical lengths of substantially a sixteenth of a wavelength are shown in FIGS. 8-10.

Figure 8:
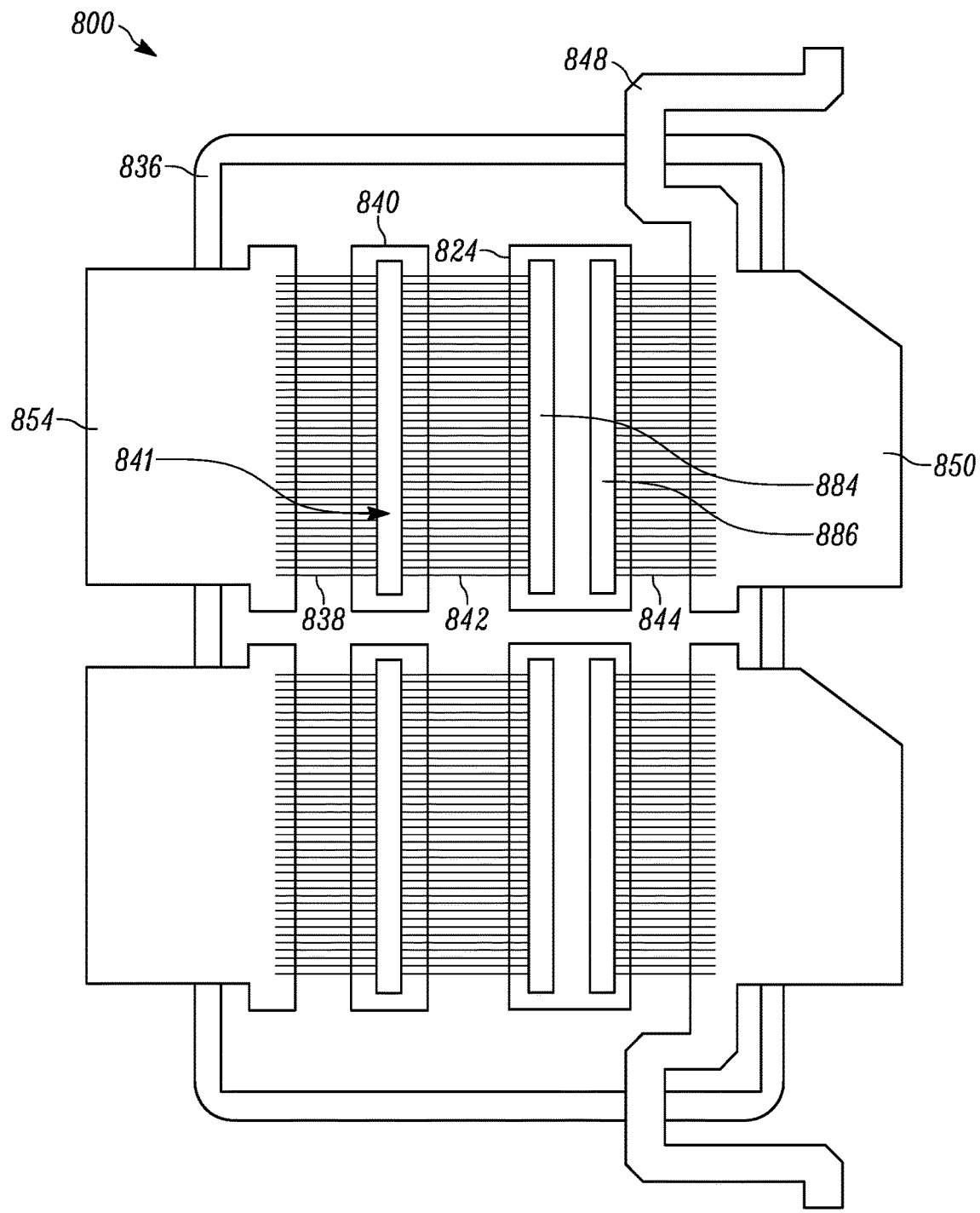
FIG. 8 shows a top view of a packaged transistor device with its cover removed, in accordance with some embodiments.

FIG. 8 shows a top view of a packaged transistor device 800 with its cover removed, providing a full view of integrally formed output leads with bias line portions having an electrical length of substantially a sixteenth of a wavelength of the fundamental operating frequency of the device 800. Components of the device 800 correspond to components of the device 400. Specifically, an isolation structure 836; a standard input lead 854; a capacitor 840 with a first terminal 841; a transistor die 824 with a gate terminal 884 and a drain terminal 886; bondwires 838, 842, and 844; and an integrally formed output lead with a signal portion 850 and a bias line portion 848 correspond to the isolation structure 436; the standard input lead 454; the capacitor 440 with the first terminal 441; the transistor die 424 with the gate terminal 484 and the drain terminal 486; the bondwires 438, 442, and 444; and the integrally formed output lead with the signal portion 450 and the bias line portion 448, respectively.

As shown, the fundamental operating frequency of the device 800 may be substantially the same as for the device 400. With wavelength (λ) being inversely proportional to frequency, the physical length of the λ/16 bias line portion 848 is substantially half that of the λ/8 bias line portion 448. At a fundamental operating frequency of 800 MHz, for example, the physical lengths of the λ/8 and λ/16 bias line portions 448 and 848 are approximately 874 mils and 437 mils, respectively. At a fundamental operating frequency of 6 GHz, the physical lengths of the λ/8 and λ/16 bias line portions 448 and 848 are approximately 116 mils and 58 mils, respectively. For embodiments (not shown) where the fundamental operating frequency of the device 800 is half that of the device 400, the physical lengths of the λ/8 and λ/16 bias line portions 448 and 848 are approximately the same.

As shown, the bias line portion 848 is made physically shorter than the bias line portion 448 by making the upper and lower substantially straight horizontal sections of the bias line portion 848 physically shorter than the upper and lower substantially straight horizontal sections of the bias line portion 448. In other embodiments, different parts of the bias line portion 848 can be made physically shorter and/or longer in different ratios with the corresponding parts of the bias line portion 448.

FIG. 9 shows another spatial arrangement for an integrally formed output lead, relative to a packaged transistor device, from that shown in FIG. 8. In particular, FIG. 9 shows the position and shape of a lead having a signal portion 950 and a sixteenth-wavelength bias line portion 948 relative to a perimeter 936 of a package 900 drawn to include a standard input lead 954.

As compared to the lower substantially straight horizontal section of the bias line portion 848, which parallels the horizontal perimeter of the device 800, the bottom section of the "horseshoe" for the bias line portion 948 does not parallel the horizontal perimeter 936 of the device 900. Instead, this section of bias line portion 948 makes an angle of approximately 45 degrees with the horizontal perimeter 936 and with the horizontal edge of the signal portion 950 of the lead. The upper substantially straight horizontal section of the bias line portion 948, defining the top of the "horseshoe," runs parallel to the horizontal perimeter 936 without the vertical gap shown between the upper substantially straight horizontal section of the bias line portion 848 and the horizontal perimeter of the device 800.

FIG. 10 shows an integrally formed output lead 1000, which for an embodiment represents the sixteenth-wavelength upper output lead of FIG. 9. The lead 1000 has a signal portion 1050 with a proximal 1088 end, a distal end 1090, and a lateral extension 1099. The lead 1000 also has a bias line portion 1048 with proximal 1092 and distal 1094 ends. The distal end 1090 of the signal portion 1050 is physically separate from the distal end 1094 of the bias line portion 1048. The proximal end 1092 of the bias line portion 1048 of the lead 1000 is integrated with the signal portion 1050 of the lead 1000. A clipped corner on the distal end 1090 of the signal portion 1050 indicates that the lead 1000 is an output lead. Clipped corners shown for the bias line portion 1048 (e.g., the clipped corner proximate to the distal end 1094 of the bias line portion 1048) facilitate the flow of the charge carriers representing the DC bias current through the bias line portion 1048 of the lead 1000.

An upper substantially straight horizontal section 1098 and a lower substantially straight angled section 1096, together with a substantially straight vertical section connecting the sections 1098 and 1096, give the bias line portion 1048 its horseshoe shape. In other embodiments, a bias line portion of an integrally formed input or output lead can take on other shapes directed to making efficient use of PCB space. Integrally formed leads having bias line portions which are not folded back on themselves (i.e., which do not have multiple parallel horizontal sections) are shown in FIGS. 11-13.

Figure 11:
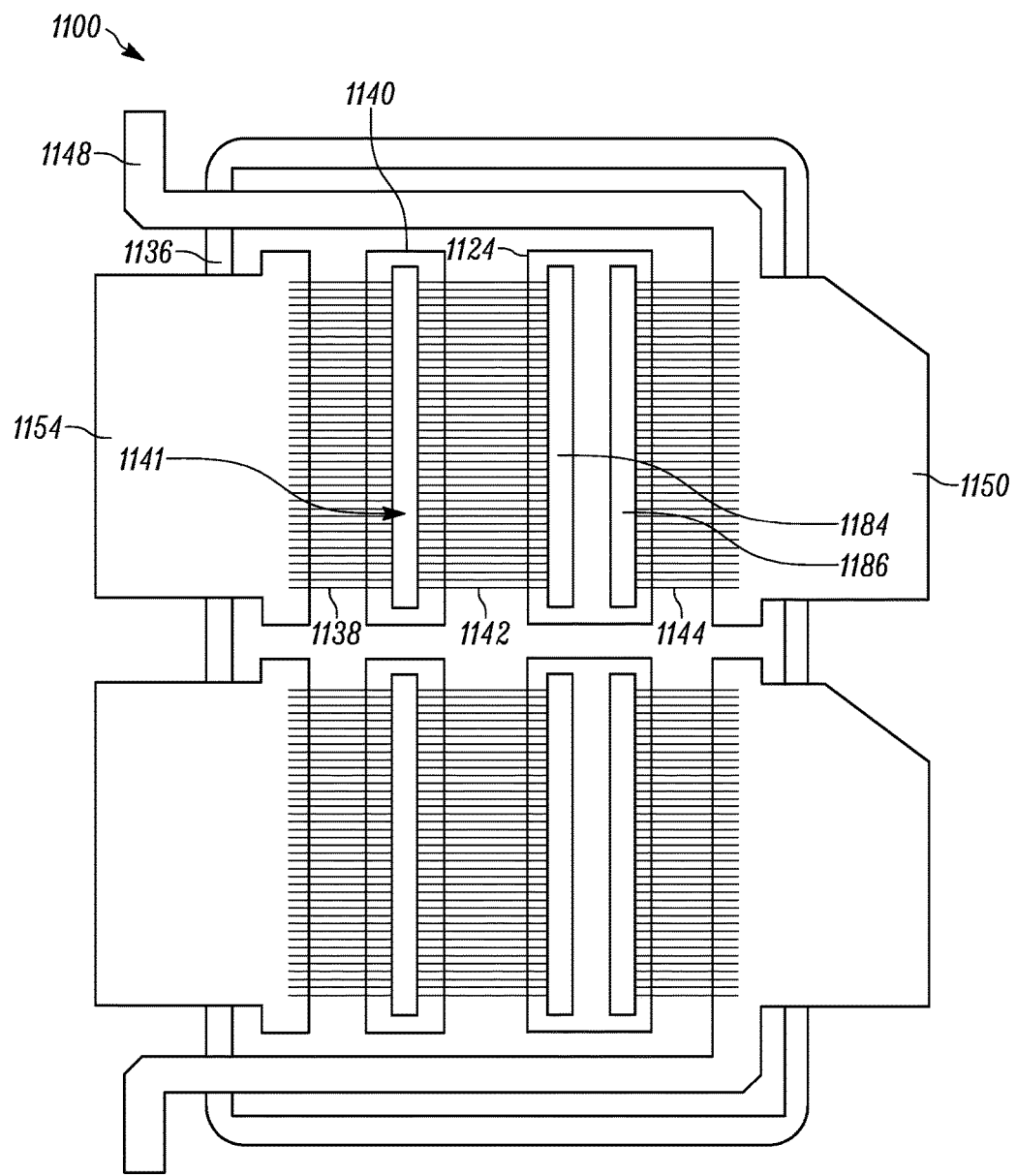
FIG. 11 shows a top view of a packaged transistor device with its cover removed, in accordance with some embodiments.

FIG. 11 shows a top view of a packaged transistor device 1100 with its cover removed, providing a full view of integrally formed output leads having bias line portions without the previously described horseshoe geometry. For an embodiment, components of the device 1100 correspond to components of the device 400. Specifically, an isolation structure 1136; a standard input lead 1154; a capacitor 1140 with a first terminal 1141; a transistor die 1124 with a gate terminal 1184 and a drain terminal 1186; bondwires 1138, 1142, and 1144; and an integrally formed output lead with a signal portion 1150 and a bias line portion 1148 correspond to the isolation structure 436; the standard input lead 454; the capacitor 440 with the first terminal 441; the transistor die 424 with the gate terminal 484 and the drain terminal 486; the bondwires 438, 442, and 444; and the integrally formed output lead with the signal portion 450 and the bias line portion 448, respectively.

As shown, the bias line portion 1148 has a substantially straight horizontal section inside the device 1100 that runs parallel to the perimeter of the device 1100 along an entire side of the device 1100. This places the distal end of the bias line portion 1148 on the opposite side (the input side) of the device 1100 from the side (the output side) at which the proximal end of the bias line portion 1148 is located. This allows greater flexibility in designing the traces for PCBs. Also, by having a majority of the length of the bias line portion 1148 run parallel to the perimeter of the device 1100, either on the inside or the outside of the device 1100, other components on a PCB to which the device 1100 is mounted can be brought in closer to the device 1100.

Figure 12:
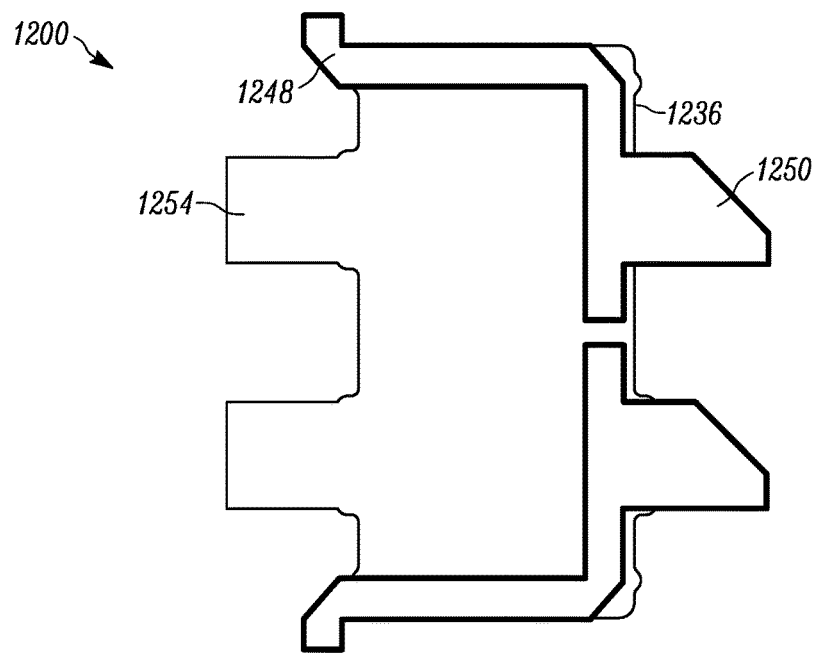
FIG. 12 shows a top view of a packaged transistor device with its cover removed, in accordance with some embodiments.
Figure 13:
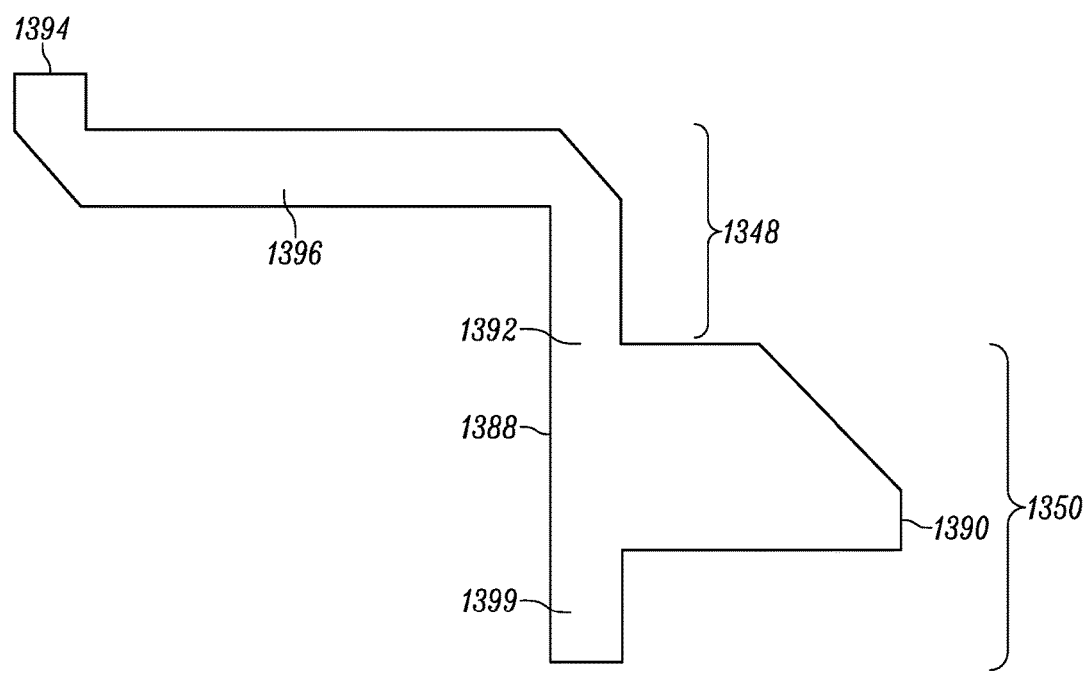
FIG. 13 shows a top view of a lead for a packaged transistor device, in accordance with some embodiments.

FIG. 12 shows another spatial arrangement for an integrally formed output lead, relative to a packaged transistor device, from that shown in FIG. 11. In particular, FIG. 12 shows the position and shape of a lead having a signal portion 1250 and an eighth-wavelength bias line portion 1248 relative to a perimeter 1236 of a package 1200 drawn to include a standard input lead 1254. The bias line portion 1248 is shown in closer proximity to the perimeter 1236 than bias line portion 1148 is to the perimeter of the device 1100.

For an embodiment, the bias line portion 1248 has the same physical length as the bias line portion 448 pictured in FIG. 4.

FIG. 13 shows an integrally formed output lead 1300, which for an embodiment represents the eighth-wavelength upper output lead of FIG. 12. The lead 1300 has a signal portion 1350 with a proximal 1388 end, a distal end 1390, and a lateral extension 1399. The lead 1300 also has a bias line portion 1348 with proximal 1392 and distal 1394 ends. The distal end 1390 of the signal portion 1350 is physically separate from the distal end 1394 of the bias line portion 1348. The proximal end 1392 of the bias line portion 1348 of the lead 1300 is integrated with the signal portion 1350 of the lead 1300. As pictured, the distal end 1394 of the bias line portion 1348 is located to the left of the proximal end 1392 of the bias line portion 1348. By comparison, the distal ends 694 and 1094 of the bias line portions 648 and 1048 of the leads 600 and 1000 (FIGS. 6, 10) are located to the right of the proximal ends 692 and 1092 of the bias line portions 648 and 1048, respectively.

By having a part of the bias line portion of an integrally formed lead inside of a packaged transistor device, as shown in FIGS. 4, 5, 8, 9, 11, and 12, and by having another part of the bias line portion outside of the packaged transistor device run close to the perimeter of the device, as shown in FIGS. 4, 5, 8, and 9, more of a PCB can be utilized for other components. Further, these other components can be brought in closer to the packaged transistor device, making more efficient use of PCB space.

By having a bias line portion of an integrally formed output lead integrated with the signal portion of the lead, as shown in FIGS. 4-6 and 8-13, higher bias currents for high-power transistor devices can be handled as compared to packaged transistor devices without integrally formed leads. This is because the bias feed is attached directly to the RF output lead when using integrally formed leads.

Although some of the specific embodiments discussed above are said to correspond to bias line portions with specific electrical lengths (e.g., $\lambda/8$ and $\lambda/16$, specifically), those of skill in the art would understand that the electrical lengths could be longer or shorter, as well. In various embodiments, the electrical length of a bias line portion is less than or equal to $\lambda/4$. In other embodiments, the electrical length of a bias line portion may be greater than $\lambda/4$.

Further, although FIGS. 3-5, 8, 9, 11, and 12 depict integrally formed leads (including signal and bias line portions) that are utilized at the outputs of various devices to facilitate delivery of bias voltages to a transistor output terminal (e.g., a drain terminal), such integrally formed leads also or alternatively may be utilized at the inputs of various devices to facilitate delivery of bias voltages to a transistor input terminal (e.g., a gate terminal).

In the foregoing specification, specific embodiments have been described. However, one of ordinary skill in the art appreciates that various modifications and changes can be made without departing from the scope of the disclosure as set forth in the claims below. Accordingly, the specification and figures are to be regarded in an illustrative rather than a restrictive sense, and all such modifications are intended to be included within the scope of present teachings. The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendment made during the pendency of this application and all equivalents of those claims as issued.

Moreover in this document, the terms "comprises," "comprising," "has," "having," "includes," "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. The terms "substantially," "essentially," "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%.

As used herein, the term "configured to," "configured with," "arranged to," "arranged with," "capable of" and any like or similar terms means that referenced elements have a physical arrangement and/or physical coupling and/or connectivity with other elements in an inactive state. This physical arrangement and/or physical coupling and/or connectivity while in the inactive state enables the elements to perform stated functionality while in the active state. Although the various circuit schematics shown herein depict certain example arrangement of elements, additional intervening elements, devices, features, or components may be present in an actual embodiment, assuming that the functionality of the given circuit is not adversely affected.

Also, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

1. A packaged transistor device comprising:
 a device package having an interior and a perimeter;
 a transistor die within the interior of the device package; and a lead extending from the interior of the device package past the perimeter, wherein the lead is electrically coupled to the transistor die, the lead comprises a signal portion and a bias line portion, the signal portion of the lead has a proximal end, a distal end, parallel first and second edges extending in a first direction between the proximal and distal ends of the signal portion, and a signal portion width dimension equal to a first distance between the parallel first and second edges, and wherein the bias line portion of the lead has a proximal end, a distal end, parallel third and fourth edges extending in a second direction from the signal portion, and a bias line width dimension equal to a second distance between the parallel third and fourth edges, wherein the bias line width dimension is substantially smaller than the signal portion width dimension, wherein the distal ends of the signal portion and the bias line portion are physically separate from each other, and wherein the signal portion and the bias line portion are integrally formed together as a single conductive component.

2. The packaged transistor device of claim 1, wherein:
the lead is coupled to a current conducting terminal of the transistor die;
the signal portion of the lead is a radio frequency signal output portion; and
the bias line portion of the lead is a fixed-voltage input portion.

3. The packaged transistor device of claim 1, wherein:
the lead is coupled to a control terminal of the transistor die;
the signal portion of the lead is a radio frequency signal input portion; and
the bias line portion of the lead is a fixed-voltage input portion.

4. The packaged transistor device of claim 1, wherein:
the proximal end of the bias line portion of the lead is integrated with the signal portion of the lead; and
the distal end of the bias line portion of the lead is outside the perimeter of the device package.

5. The packaged transistor device of claim 4, wherein the distal end of the signal portion of the lead also is outside the perimeter of the device package.

6. The packaged transistor device of claim 4, wherein an electrical length of the bias line portion of the lead, as measured between the proximal and distal ends of the bias line portion of the lead, is less than a quarter wavelength at a fundamental frequency at which the packaged transistor device is designed to operate.

7. The packaged transistor device of claim 6, wherein the electrical length of the bias line portion of the lead is substantially equal to an eighth of a wavelength at the fundamental frequency.

8. The packaged transistor device of claim 6, wherein the electrical length of the bias line portion of the lead is substantially equal to a sixteenth of a wavelength at the fundamental frequency.

9. The packaged transistor device of claim 6, wherein the fundamental frequency is in a range of 800 megahertz to 6.0 gigahertz, and wherein a physical length of the bias line portion of the lead, as measured between the proximal and distal ends of the bias line portion of the lead, is in a range of 50 mils to 1800 mils.

10. The packaged transistor device of claim 1, wherein at least a section of the bias line portion of the lead runs parallel to an outside edge of the perimeter of the packaged transistor device.

11. The packaged transistor device of claim 10, wherein a part of the bias line portion of the lead that runs parallel to the outside edge of the packaged transistor device is located inside of an enclosure for the packaged transistor device, wherein an outside dimension of the enclosure defines the perimeter of the device.

12. The packaged transistor device of claim 1, wherein the bias line width dimension is less than half the signal portion width dimension.

13. The packaged transistor device of claim 1, wherein the bias line width dimension is substantially smaller than the signal portion length dimension.

14. The packaged transistor device of claim 1, wherein the signal portion extends from a first side of the device package, and the bias line portion extends from a second side of the device package.

15. The packaged transistor device of claim 14, wherein the first side is perpendicular to the second side.

16. The packaged transistor device of claim 14, wherein the first side is parallel with the second side.

17. A lead for a packaged transistor device having a device package with an interior and a perimeter and a transistor die within the interior of the device package, the lead extending from the interior of the device package past the perimeter and comprising:
a signal portion comprising a proximal end, a distal end, parallel first and second edges extending in a first direction between the proximal and distal ends of the signal portion, and a signal portion width dimension equal to a first distance between the parallel first and second edges; and
a bias line portion comprising a proximal end, a distal end, parallel third and fourth edges extending in a second direction from the signal portion, and a bias line width dimension equal to a second distance between the parallel third and fourth edges, wherein the bias line width dimension is substantially smaller than the signal portion width dimension;
wherein the signal portion and the bias line portion are integrally formed together as a single conductive component, with the proximal end of the bias line portion integrated into the signal portion of the lead and with the distal ends of the signal portion and the bias line portion physically separate from each other.

18. The lead of claim 17, wherein:
the first edge is partially defined by a length dimension; and
the bias line portion is partially defined by a length dimension that extends between the proximal and distal ends of the bias line portion, and the bias line width dimension is perpendicular to the length dimension, and wherein the bias line width dimension is substantially smaller than the length dimension of the first edge of the signal portion.

19. The lead of claim 18, wherein the bias line portion extends in a direction that is substantially perpendicular to the first edge of the signal portion.

20. The lead of claim 18, wherein the bias line portion includes one or more bends along the length dimension.

21. The lead of claim 20, wherein at least one bend of the one or more bends is a 90 degree bend.

22. The lead of claim 17, wherein an electrical length of the bias line portion, as measured between the proximal and distal ends of the bias line portion of the lead, is less than a quarter wavelength of a frequency within a range of 800 megahertz to 6.0 gigahertz.

23. An amplifier comprising:
a packaged transistor device that includes a transistor die in an interior of the packaged transistor device; and
a lead extending from the interior and past a perimeter of the packaged transistor device, wherein the lead is electrically coupled to the transistor die, the lead comprises a signal portion and a bias line portion, the signal portion of the lead has a proximal end, a distal end, parallel first and second edges extending in a first direction between the proximal and distal ends of the signal portion, and a signal portion width dimension equal to a first distance between the parallel first and second edges, and wherein the bias line portion of the lead has a proximal end, a distal end, parallel third and fourth edges extending in a second direction from the signal portion, and a bias line width dimension equal to a second distance between the parallel third and fourth edges, wherein the bias line width dimension is substantially smaller than the signal portion width dimension, wherein the distal end of the signal portion and the distal end of the bias line portion are physically separate from each other, and wherein the signal portion and the bias line portion are integrally formed together as a single conductive component.

24. The amplifier of claim 23, wherein:
the proximal end of the signal portion is electrically connected to a terminal of the transistor die selected from a control terminal and a current conducting terminal; and
the distal end of the signal portion is electrically connected to a conductive trace on a substrate to which the packaged transistor device is mounted.

25. The amplifier of claim 24, wherein:
the proximal end of the bias line portion is integrated into the signal portion of the lead; and
the distal end of the bias line portion is electrically connected to a fixed-voltage conductive trace on the substrate.

* * * * *